United States Patent [19]
Dietrich

[11] Patent Number: 5,435,889
[45] Date of Patent: Jul. 25, 1995

[54] PREPARATION AND COATING OF COMPOSITE SURFACES

[75] Inventor: Herbert Dietrich, New City, N.Y.

[73] Assignee: Chromalloy Gas Turbine Corporation, Orangeburg, N.Y.

[21] Appl. No.: 277,141

[22] Filed: Nov. 29, 1988

[51] Int. Cl.⁶ .............................. B44C 1/22
[52] U.S. Cl. ........................ 216/63; 428/163; 428/173; 427/292; 427/309; 216/52; 216/39; 216/79; 216/76
[58] Field of Search ........... 156/643, 645, 654, 655, 156/657, 663, 667; 427/203, 290, 292, 309, 419.7; 428/156, 161, 163, 167, 169, 173, 488

[56] References Cited

U.S. PATENT DOCUMENTS

| | | | |
|---|---|---|---|
| 2,596,546 | 8/1952 | Grimes | 117/122 |
| 3,310,433 | 3/1967 | Tragert | 427/292 X |
| 3,467,540 | 9/1969 | Schick | 117/47 |
| 3,930,071 | 12/1975 | Rao et al. | 427/203 |
| 3,959,528 | 5/1976 | Takeda et al. | 427/290 |
| 4,005,991 | 2/1977 | Uebayasi et al. | 29/196.2 |
| 4,109,050 | 8/1978 | Mehan et al. | 427/309 X |
| 4,367,246 | 1/1983 | Lersmacher et al. | 427/309 X |
| 4,515,860 | 5/1985 | Hoizi | 428/408 |
| 4,673,450 | 6/1987 | Burke | 156/153 |

*Primary Examiner*—Peter A. Nelson
*Attorney, Agent, or Firm*—Mitchell D. Bittman

[57] ABSTRACT

A process is disclosed for coating a ceramic composite in which the composite has a pattern of grooves cut into the surface followed by coating to increase adhesion and inhibit cracking of the coating.

15 Claims, 4 Drawing Sheets

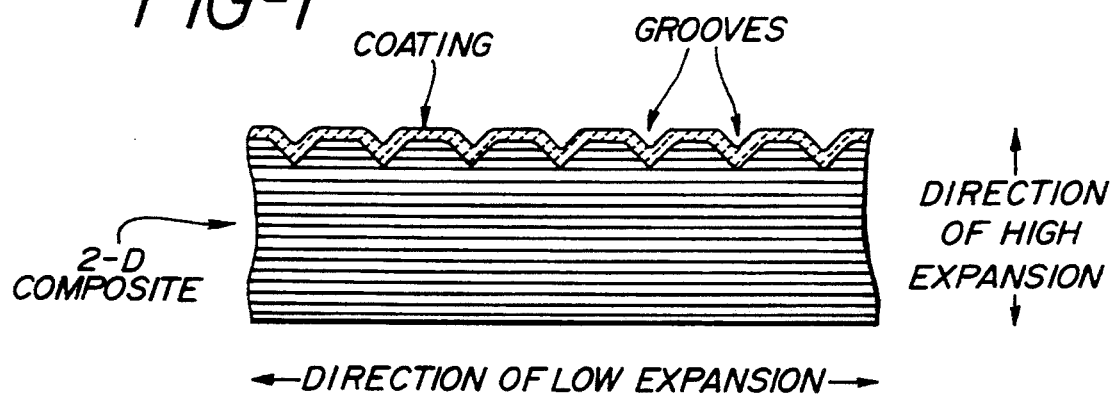
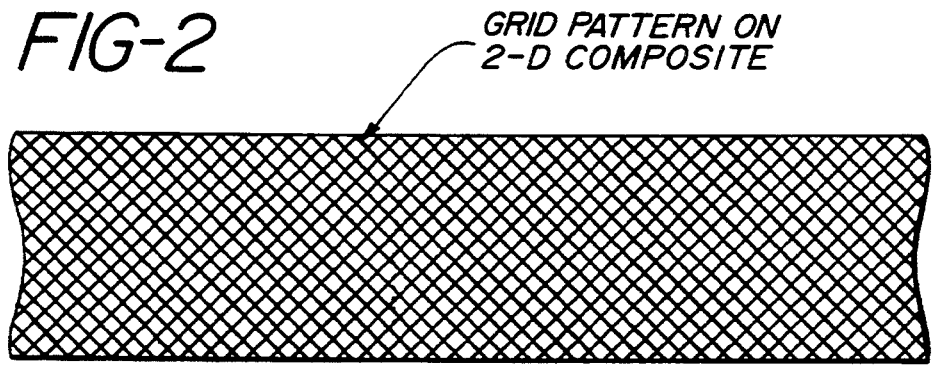
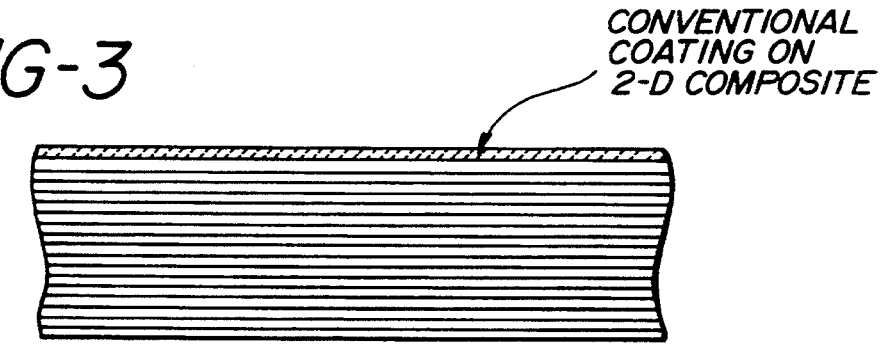
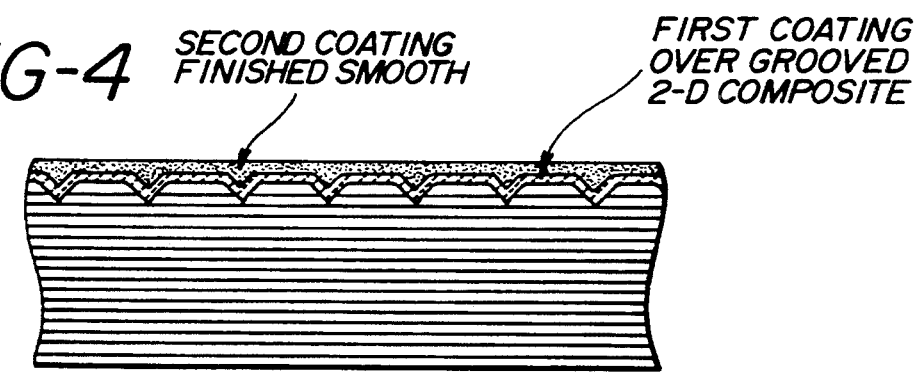

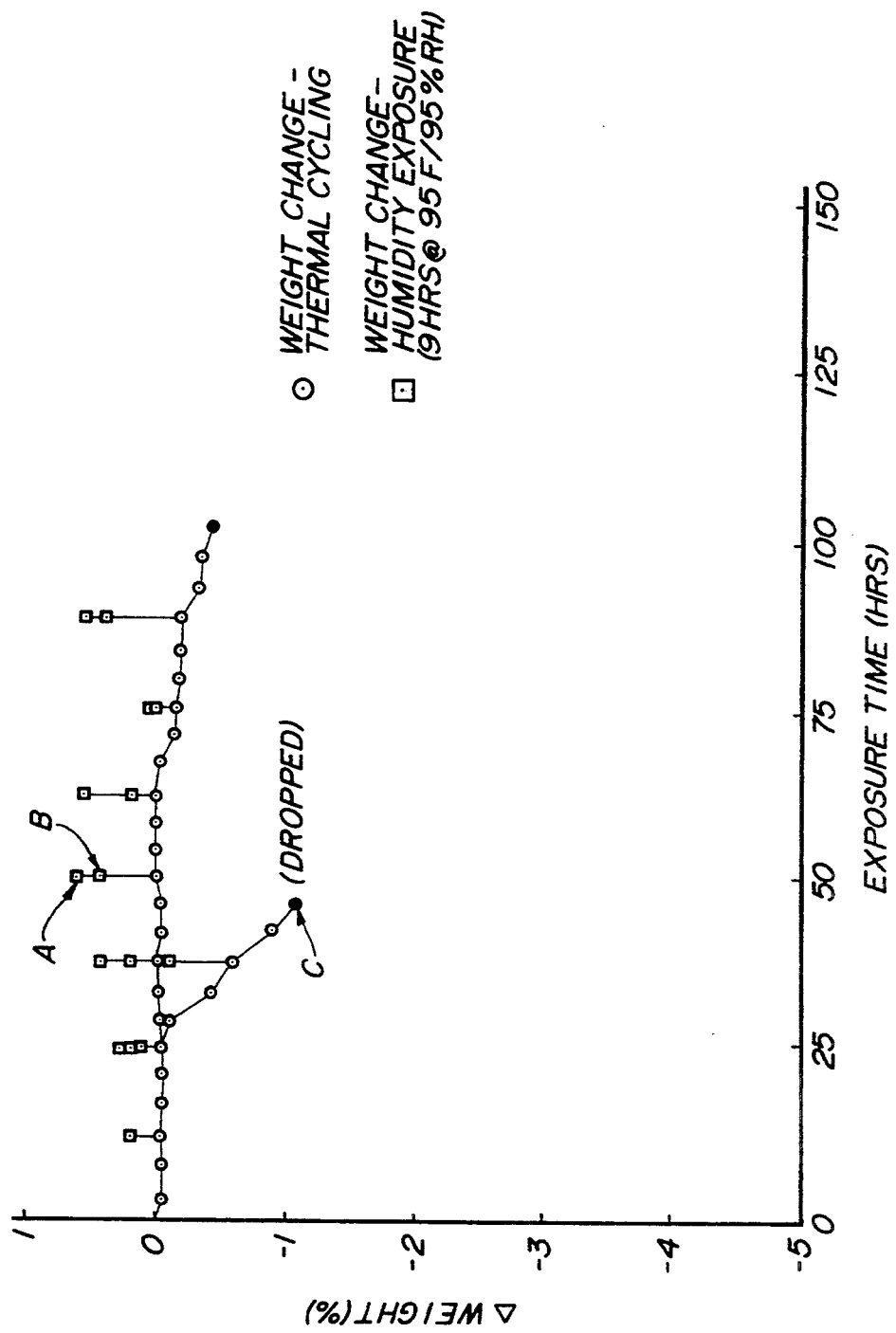

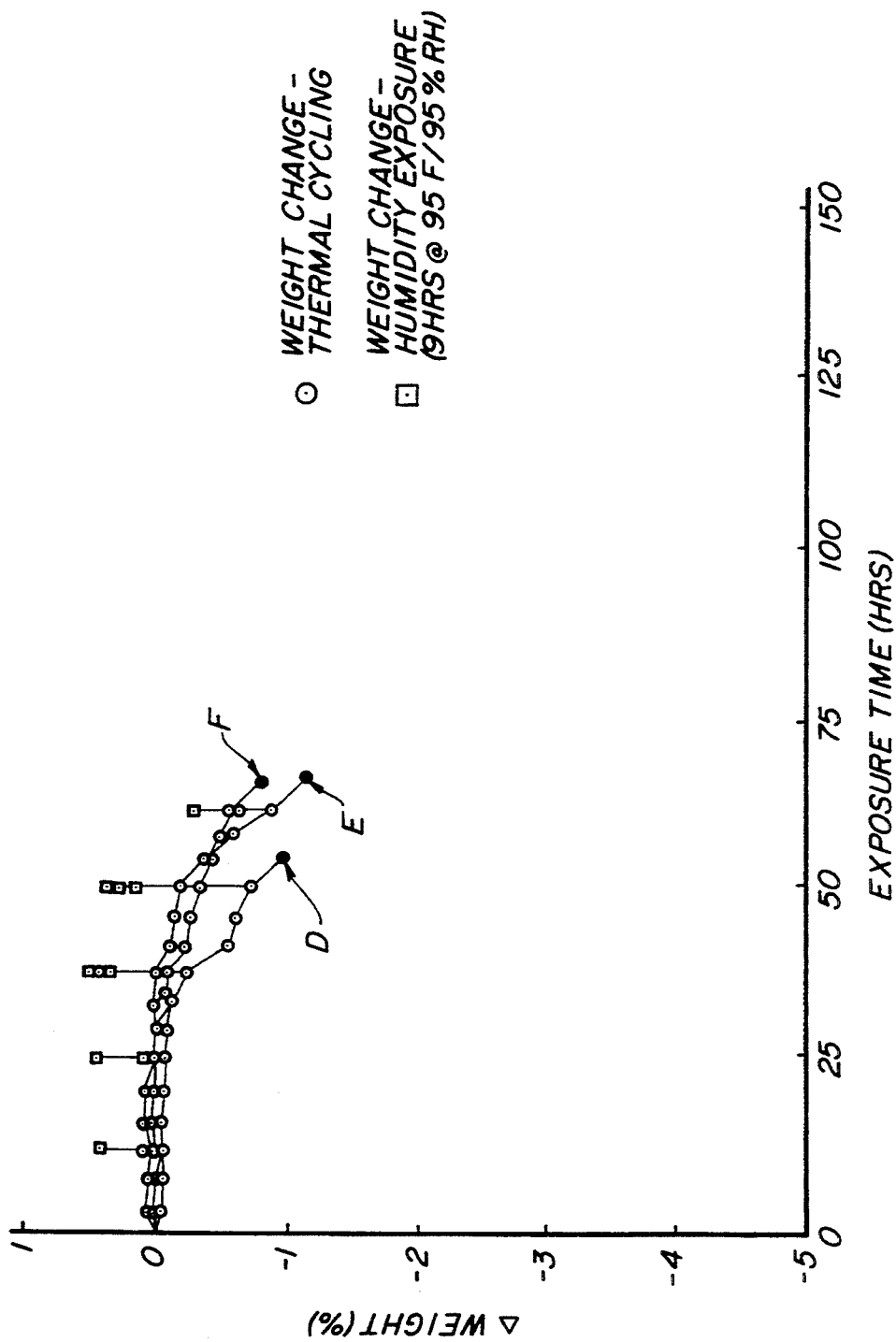

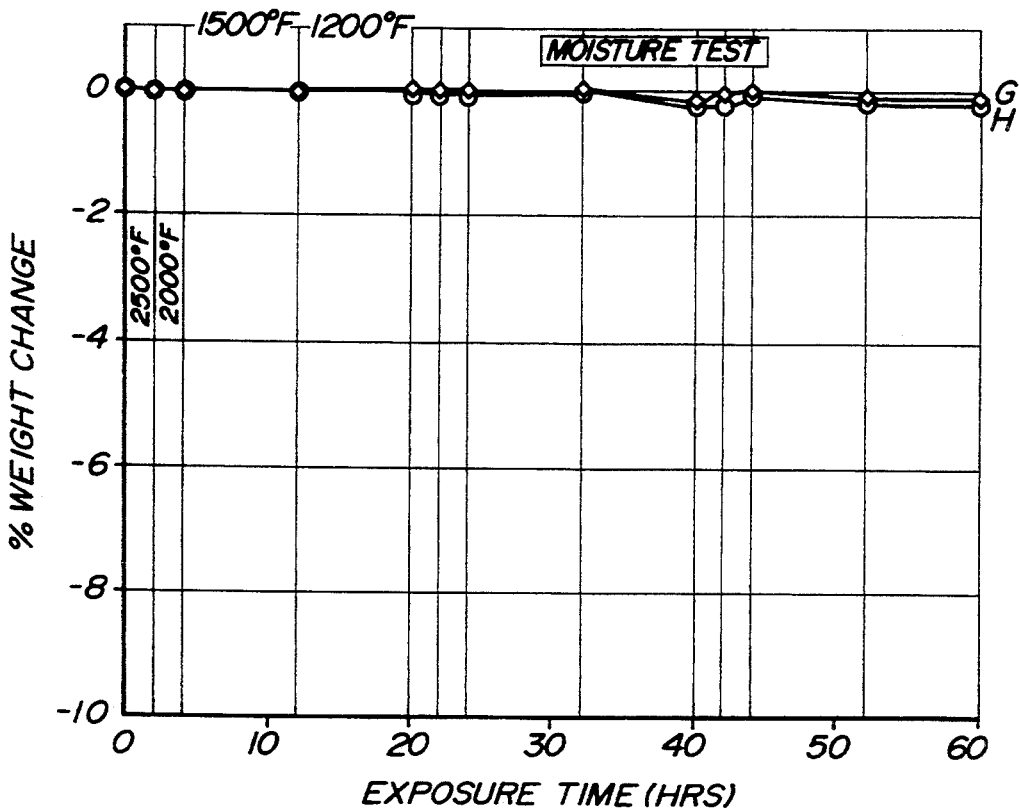
FIG-7 MACHINED COUPONS
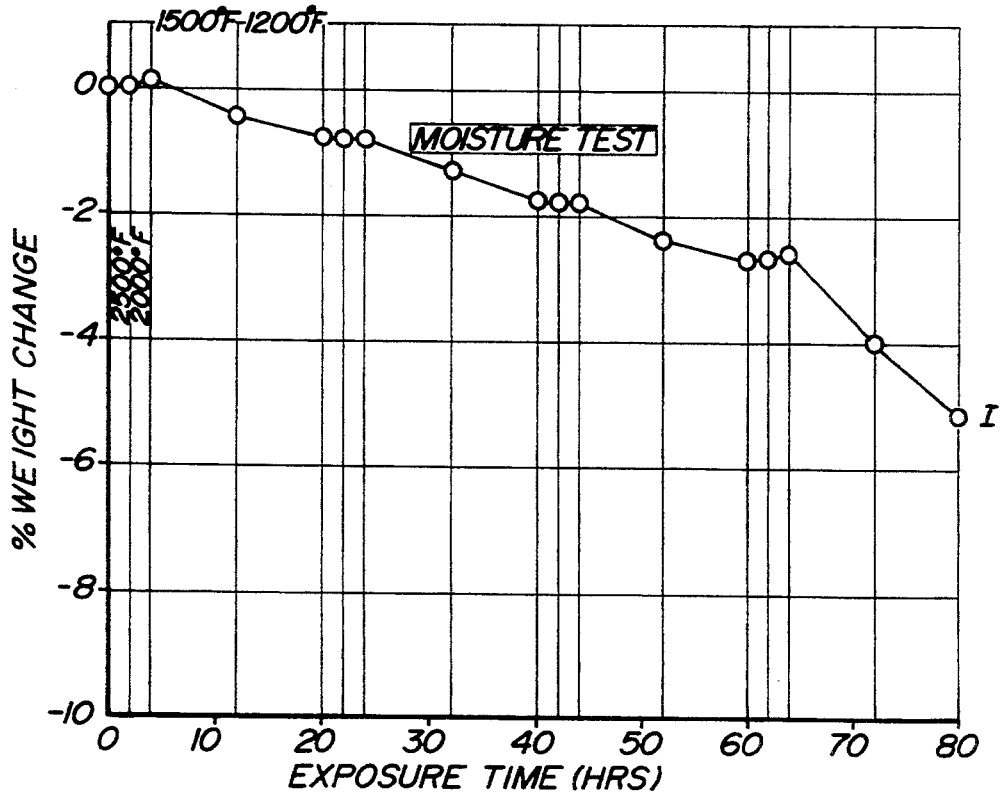
FIG-8 PLAIN SURFACE COUPONS

PREPARATION AND COATING OF COMPOSITE SURFACES

TECHNICAL FIELD

This invention relates generally to coating composite surfaces and more particularly to preparation of the composite surface prior to coating to increase adhesion of the coating to the surface and inhibit cracking of the coating.

BACKGROUND OF THE INVENTION

Ceramic composites are becoming of increasing importance as construction materials for components such as gas turbine parts, air frame components, rocket engine components, pump impellers and the like which are exposed to high temperature environments and/or abrasive or corrosive conditions. Often ceramic materials are reinforced to increase resistance to fracture by the addition of a dispersed second phase or fibers such as with the ceramic composites of $Al_2O_3$—$ZrO_2$, $Si_3N_4$—$SiC$, $Al_2O_3$—$TiC$, fiber reinforced silicon carbide, and partially stabilized $ZrO_2$. The best known composites are made from two-dimensional fabrics and/or fibers dispersed in a resin or plastic matrix. These composites are basically a resin or plastic structure to which reinforcing fabrics or fibers have been added to enhance the physical properties of the structure.

A wide range of multidirectional reinforced composite structures are now available. The simplest of these structures is obtained by stacking unidirectional fibers or sheets with alternating layers oriented in difference directions, or by stacking woven sheets. More complex structures provide three-dimensional reinforcement. The simplest of the three-dimensional structures is the three-directional (3D) structure which generally has reinforcing elements which are mutually orthogonal. The most complex three-dimensional structure is the thirteen-directional (13D) structure. The thirteen directions, with reference to a cube, form three subgroups; the three edges, the four long diagonals, and the six diagonals of the faces.

Carbon-carbon composites are a class of materials whose properties, especially at elevated temperatures, make them attractive for various aerospace applications. The materials are composites although all of the composite elements are comprised essentially of carbon, in its various allotropic forms. Carbon-carbon materials are produced starting with organic precursor fibers such as polyacrylonitrile, rayon or pitch. Such fibers are usually produced in bundles (yarn), often by an extrusion process. The precursor fibers are heated in an inert atmosphere to pyrolyze or carbonize them and may then be heated to a higher temperature (e.g. 2204° C.) to form graphite fibers. These carbon or graphite materials may then be laid down, woven, or interleaved to form what are referred to as 1D, 2D, 3D, etc. structures where D stands for direction (i.e. in a 2D structure fibers are laid in two, usually orthogonal, directions). These woven structures can then be impregnated with a pitch or resin material which is converted to carbon and then graphite. In this process, hot pressing is sometimes employed to obtain a dense structure. Repeated impregnation steps can be employed to increase density. An alternative processing scheme is to use chemical vapor deposition (CVD) to deposit pyrolytic graphite on the woven structures to densify the structure.

The drawback to these ceramic composites is their susceptibility to oxidative and corrosive attacks, particularly at high temperatures. Coatings have been applied to protect the composites from oxidation and corrosion. However, major difficulties have been encountered with coated ceramic materials as shown in FIG. 3. Proper adhesion of the coating to the ceramic can be difficult because of the stresses which develop due to the varying degrees of thermal expansion of the ceramic and the coating. As a result, especially in high temperature applications, cracking of the coating frequently occurs allowing oxidation and a corrosive attack on the ceramic substrate. In addition, mechanical vibrations and other forms of physical stress or even debris damage may cause cracking and spalling of the protective coating layer if proper adhesion of the coating to the ceramic is not achieved.

Various attempts have been made in the art to relieve the foregoing problems associated with thermal expansion mismatch. Among the solutions includes coating the ceramic with an oxygen scavenging sealant layer to provide protection or a gradient in the thermal coefficient of expansion from the ceramic substrate to the outer oxidation resistant coating. A carbon body with an oxidation resistant coating is disclosed in U.S. Pat. No. 4,515,860 in which a coating is formed of a silicon alloy having a non-columnar grain distribution.

SUMMARY OF THE INVENTION

Briefly, this invention provides a process for coating a ceramic composite and a product produced thereby comprising cutting into the composite surface a pattern of grooves, with the pattern effective to increase the adhesion of the coating and to expose a surface in the composite that more closely matches the thermal expansion properties of the coating, following by coating the cut substrate surface. In a preferred embodiment the composite has a 2D or greater structure and a grid pattern of grooves is cut into the composite.

BRIEF DESCRIPTION OF THE DRAWINGS

The present invention will be understood from the foregoing and the following description taken with the accompanying drawings, in which:

FIG. 1 is a schematic cross sectional view of a 2D composite which is cut and coated in accordance with the present invention;

FIG. 2 is a schematic top view of the diamond grid pattern with a 90° included angle of grooves cut into the composite surface of FIG. 1;

FIG. 3 is a schematic cross sectional view of a 2D composite with a conventional coating;

FIG. 4 is a schematic view of the composite of FIG. 1 with a second coating applied;

FIGS. 5 and 7 are graphs pursuant to the Example showing the change in weight over time caused by thermal cycling and humidity exposure of a composite machined and coated pursuant to this invention; and FIGS. 6 and 8 are graphs pursuant to the Example showing the change in weight over time caused by thermal cycling and humidity exposure of a conventionally coated composite.

DETAILED DESCRIPTION OF THE INVENTION

The process of this invention prepares the surface of a ceramic composite to increase adhesion of the coating and to alter the surface in a manner that permits the surface to emulate properties, particularly thermal expansion properties which are closer to that of the coating.

The process of surface preparation disclosed is applicable to various ceramic composites, particularly those that exhibit anisotropic properties (i.e. properties which vary depending upon direction), such as thermal expansion. Composite materials fabricated from particulates within a matrix phase, or fibers (continuous or discontinuous) within a matrix phase usually exhibit anisotropic properties. This anisotropy greatly affects the performance of coatings which are applied to the composite surface for the purpose of providing oxidation protection.

Various types of fibers and ceramic matrices can be employed in the ceramic composite. Of particular interest are the high temperature fiber reinforced composites which include fibers such as carbon, silicon carbide, alumina-boria-silicate or other ceramic fibers with matrices such as carbon, boron carbide, silicon carbide, silicon nitride, boron nitride or other ceramic matrices as well as lower temperature matrix materials such as epoxy resins and polyimide resins. Examples of such fibers, matrices and reinforced composites can be found in U.S. Pat. Nos. 4,321,291, 4,405,685, 4,409,048, 4,476,164, 4,425,407, 4,472,476, 4,476,178 and 4,485,179. A variety of multidirectional reinforced composite structures can benefit from this process with a 2D or greater structure being preferred.

The method of preparing the composite surface alters the surface in a manner that permits the surface to emulate one having thermal expansion properties that are closer to that of the coating. This emulation can reduce the frequency of cracking and the width of those cracks that do develop within the coating. The surface preparation method involves cutting or machining into the surface and edges of the composite surface to be coated a pattern of shallow grooves, preferably a pattern which resembles a grid as shown in FIGS. 1 and 2. The width, depth, spacing, and intersection angle of the grooves defines the pattern in the composite surface. A wide variety of combinations of patterns are applicable. In a preferred embodiment the grooves are 5 to 30 mils deep, 30 to 40 mils wide, spaced 25 to 100 mils apart, and intersecting at 30 to 90 degree angles to obtain improved coating performance as measured by oxidation testing.

The degree of cutting or machining required to produce the desired effect is variable depending on the characteristics of the composite and the specific application intended. For a typical multiply carbon fiber reinforced composite (8 to 15 mils per ply) preferably the groove depth is on the order of one ply thickness or less, but generally not less than 5 mils.

Ideally spacing of the grooves is less than the natural crack frequency distance of the coating being applied to the given substrate. The crack frequency distance is the average distance encountered between cracks that develop in the coating as result of thermal expansion mismatch. While groove spacings less than or equal to the crack frequency distance are preferred, larger spacings are still acceptable. Groove spacings up to 250 mils are functional, while the preferred spacings are between 25 and 100 mils. Spacings less than 25 mils are possible, but the cost of machining them is high.

The contour of the groove is dependent on the shape of the cutting tool used to impart the groove. The shape may be square, rectangular, "V"-shaped, "U"-shaped, or irregular if done by laser. In a preferred embodiment a "V"-shaped groove with a blunted, or rounded bottom is cut. A "V"-shaped groove exposes more "through-plane" surface than other configurations described and a groove with a blunted bottom is less apt to propagate cracks into the surrounding composite.

The groove pattern cut or machined into the composite alters the surface properties of the composite to enhance the adhesion of a coating subsequently applied for the purpose of providing oxidation protection. Alteration consists of cutting or machining into the composite plies to create a rough surface topography which enhances mechanical locking of the coating to the substrate and to expose a surface that more closely matches the thermal expansion property of the coating. In a preferred embodiment the cutting or machining exposes more high expansion "through-plane" surface in contact with the coating while decreasing the amount of low expansion "in-plane" surface (see FIG. 1). Since the typical oxidation resistant coatings applied to composites more nearly match the high expansion surface of the substrate, adhesion and oxidation performance is greatly improved.

Techniques for imparting grooves include cutting or machining with an abrasive tipped wheel or blade, and laser machining. Other techniques include grit blasting, electron beam machining and etching. The use of the laser to impart the grooved surface texture may be especially useful for processing contoured surfaces that do not lend themselves to material removal by conventional machining.

Most 2D conventional composites as shown in FIGS. 1-3 are comprised of stacked plies of cloth in which the in-plane properties are balanced while the through-plane properties differ significantly. For this reason machining or cutting grooves in two directions (X and Y directions) is appropriate. Cutting grooves in the through-plane direction (parallel to the Z direction) while not as critical as cutting in the X and Y direction is also beneficial. Cutting grooves in a single direction would be acceptable for composites fabricated from unidirectional fibers. In this case preferably the grooves are cut or machined perpendicular to the direction of fiber reinforcement.

Following surface preparation of the ceramic composite a coating is applied to the surface. Various types of coatings can be applied to the composite substrate including metallic, ceramic and mixtures of metals and ceramics. The selection of the coating is based primarily upon the subsequent use of the coated composite and is selected based on the consideration of factors such as thermal expansion coefficients (comparative to the substrate), chemical compatibility, thickness, operating temperatures, oxidation resistance, emissivity, reflectivity and longevity. Examples of coatings that can be applied include ceramic coatings such as silicon carbide, silicon nitride, boron carbide, aluminum oxide, cordierite, molybdenum disilicide, and titanium carbide, metallic coatings which contain molybdenum, germanium, silicon, titanium and iridium, as well as various mixtures of the above including mixtures of metallics and ceramics, such as a mixture of aluminum oxide and nickel, or a mixture of molybdenum and cordierite, or a mixture of titanium carbide and iridium. Examples of such coatings can be found in U.S. Pat. Nos. 3,249,460, 4,321,298, 4,425,407, 4,472,476, 4,476,164, 4,476,178 and 4,515,860. These coatings can be applied by conventional techniques including chemical vapor infiltration, chemical vapor deposition, pack conversion, physical vapor deposition, thermal spraying or plating. Preferred embodiments include coating by chemical vapor deposition and pack conversion as these processes provide effective coatings for these types of composites.

In applications which require a smooth final surface rather than a rough or textured surface, the requirement for a smooth surface can be addressed by a second coating which fills in the grooves or depressions (i.e. after the first coating) by use of a suitable refractory coating or filler material as shown in FIG. 4. The second coating can then be smoothed off by machining, sanding, or other suitable technique. If needed, the second coating can be bonded to the primary coating by thermal heat treating.

The method of surface preparation in conjunction with an oxidation protective coating such as silicon carbide to a high temperature composite leads to a significant improvement in the lifetime of the composite under test conditions that subject the composite to both cyclic oxidizing and humid environments as shown in the following example.

EXAMPLE

Two groups of 2D carbon/carbon coupons 3"×1", made with carbon fibers (AMOCO T300) and densified by a combination of resin-pitch and pyrolytic graphite (by carbon vapor infiltration) were prepared with and without machined grooves. A grid pattern of grooves were machined with an abrasive tipped cutting wheel into one group of coupons and provided 15 mil wide "V" shaped grooves machined 15 mils deep, on 50 mil centers, with a 60 degree included angle. Both groups of coupons were simultaneously coated by chemical vapor deposition with an oxidation resistant coating consisting of siliconized silicon carbide (80–90% silicon) 10–15 mils thick, applied over 1–3 mil thick layer of a chemically vapor deposited mixture of boron carbide and silicon carbide. The boron-silicon-carbon ratio was variable, but consisted mostly of $B_xSiC$ where x varied between 6 and 14.

After coating, test coupons from both groups (with and without machining) were tested under two different procedures that exposed the coupons to cyclic oxidation and humidity exposure.

The Boeing Oxidation Test Cycle is designed to permit the rapid screening of candidate coated test specimens for application to airframe structures being considered for hypersonic aircraft. The cycle is conducted at atmospheric pressure and at the following time-temperature schedules. Humidity exposure is for a minimum of 8 hours after every three cycles at 95% RH and 95° F. Coupons are weighed after every cycle to determine weight change. Two time-temperature cycles are alternated with each other during testing, these are summarized as follows: Cycle #1 (2,400° F. for 15 minutes, 1,850° F. for 60 minutes, Rm. temperature for 30 minutes); and Cycle #2 (2,400° F. for 15 minutes, 1,350° F. for 75 minutes, 1,000° F. for 15 minutes, Rm. temperature for 30 minutes). The results of this test are shown in FIGS. 5 and 6.

The P&W Down Cycle Oxidation Test was carried out by subjecting carbon/carbon test coupons to exposures of decreasing temperatures for different lengths of time to simulate turbine engine environments. In the P&W cycle the temperature time schedule of exposure is as follows: 2,500° F. for 2 hours, 2,000° F. for 2 hours, 1,500° F. for 8 hours, 1,200° F. for 8 hours. Weight change as a function of temperature and time is used as the measure of coating and surface preparation performance. The change in weight is determined by weighing the test coupons at room temperature between the four temperature settings and then comparing the new weight to the initial coupon weight. After a total of 40 hours of cyclic exposure, the test coupons are subjected to the effects of humidity. This exposure test is conducted at room temperature at 100% relative humidity. Weight change after humidity exposure is also determined. The results of this test are shown in FIGS. 7 and 8.

The Boeing Oxidation Test depicted in the graphs of FIGS. 5 and 6 show the coating on the machined coupons A and B in FIG. 5 having a life in excess of 100 hours compared to the coating on the plain surface coupons D, E and F in FIG. 6 having a life of less than 75 hours. Machined coupon C in FIG. 5 was dropped with the coupon breaking. For the Pratt & Whitney Down Cycle Oxidation Test depicted in the graphs of FIGS. 7 and 8, the machined coupons G and H in FIG. 7 achieved a lifetime in excess of 100 hours, while the plain surface coupon I in FIG. 8 had a lifetime of less than 50 hours.

In both cases the coated coupons with the machined grooves demonstrated substantially longer lifetimes as determined by weight loss as a function of exposure time.

What is claimed:

1. Process for coating a ceramic composite comprising:
cutting into the composite surface to be coated a pattern of grooves, with the pattern being effective to increase the adhesion of the coating to the substrate and to expose a surface in the composite that more closely matches the thermal expansion properties of a coating composition; and
coating the cut substrate surface with the coating composition.

2. Process of claim 1 wherein the composite exhibits anisotropic properties.

3. Process of claim 2 wherein the ceramic composite is a fiber reinforced ceramic composite, with the fiber chosen from the group consisting of carbon, silicon carbide, alumina-boria-silicate or combinations thereof and the ceramic is chosen from the group consisting of carbon, boron carbide, silicon carbide, silicon nitride, boron nitride or combinations thereof.

4. Process of claim 2 wherein the composite has at least a two directional structure and a grid pattern of grooves is cut exposing a through-plane surface in the composite.

5. Process of claim 4 wherein the composite is a carbon/carbon composite.

6. Process of claim 1, wherein the grooves are cut by a technique chosen from the group consisting of etching and grit blasting and machining with either a blade, abrasive wheel, laser or electron beam.

7. Process of claim 4, wherein the grooves are about 5 to 30 mils deep, 30 to 40 mils wide, spaced 25 to 100 mils apart and with the grooves intersecting at 30 to 90 degree angles.

8. Process of claim 7 wherein the grooves have a "V"-shape with a rounded bottom.

9. Process of claim 4 wherein the coating exhibits a higher thermal coefficient of expansion than the composite surface prior to cutting.

10. Process of claim 9 wherein the coating composition provides oxidation protection to a high temperature resistant composite.

11. Process of claim 9 wherein the pattern is effective to increase the thermal expansion properties of the composite surface.

12. Process of claim 3 wherein the coating composition is selected from the group consisting of silicon, silicon carbide, silicon nitride, boron, boron carbide, titanium carbide, titanium, molybdenum, molybdenum disilicide, germanium, iridium, aluminum oxide, cordierite and mixtures thereof.

13. Process of claim 12 wherein the coating is carried out by a process selected from the group consisting of chemical vapor deposition and pack conversion.

14. Process of claim 1 further comprising applying to the coated composite a second coating to fill any grooves or depressions remaining after the first coating and to provide a smooth surface.

15. Product prepared by the process of any of claims 1, 2, 3, 4, 5, 7, 8, 9, 11, 12 or 14.

* * * * *